United States Patent [19]

Mochizuki et al.

[11] Patent Number: 5,150,151

[45] Date of Patent: Sep. 22, 1992

[54] REFLECTING DEVICE AND PATTERN TRANSFER APPARATUS USING THE SAME

[75] Inventors: Noritaka Mochizuki, Yokohama; Ryuichi Ebinuma, Kawasaki, both of Japan

[73] Assignee: Canon Kabushiki Kaisha, Tokyo, Japan

[21] Appl. No.: 489,194

[22] Filed: Mar. 6, 1990

[30] Foreign Application Priority Data

| Mar. 9, 1989 | [JP] | Japan | 1-55182 |
| Feb. 20, 1990 | [JP] | Japan | 2-37214 |
| Mar. 2, 1990 | [JP] | Japan | 2-51174 |

[51] Int. Cl.⁵ ............................................. G03B 27/42
[52] U.S. Cl. .................................. 355/53; 355/52; 355/66
[58] Field of Search ............... 355/53, 66, 101, 52, 355/1

[56] References Cited

U.S. PATENT DOCUMENTS

| 2,056,600 | 10/1936 | Crosier | 352/65 |
| 3,194,142 | 7/1965 | Black | 355/1 |
| 3,254,933 | 6/1966 | Latulippe | 352/65 |
| 3,280,696 | 10/1966 | Ketchian | 355/101 |
| 4,030,806 | 6/1977 | Goshima et al. | |
| 4,187,475 | 2/1980 | Wieder | |
| 4,577,959 | 3/1986 | Yazaki | |
| 4,982,222 | 1/1991 | Rees | 355/1 |

FOREIGN PATENT DOCUMENTS

| 59-124324 | 7/1984 | Japan |
| 60-208828 | 10/1985 | Japan |

OTHER PUBLICATIONS

Fundamentals of Optics, Jenkins, et al., 1957, pp. 244-246.
Handbook of Synchrotron Radiation, vol. 1B, Chap. 13, pp. 1135-1136, Grobman, 1983.

*Primary Examiner*—Monroe H. Hayes
*Attorney, Agent, or Firm*—Fitzpatrick, Cella, Harper & Scinto

[57] ABSTRACT

A reflecting device includes a reflection surface for reflecting light inputted thereto from a predetermined direction; and a driving mechanism for moving the reflection surface without causing a change in a direction of reflection and a position of reflection of the inputted light.

10 Claims, 5 Drawing Sheets

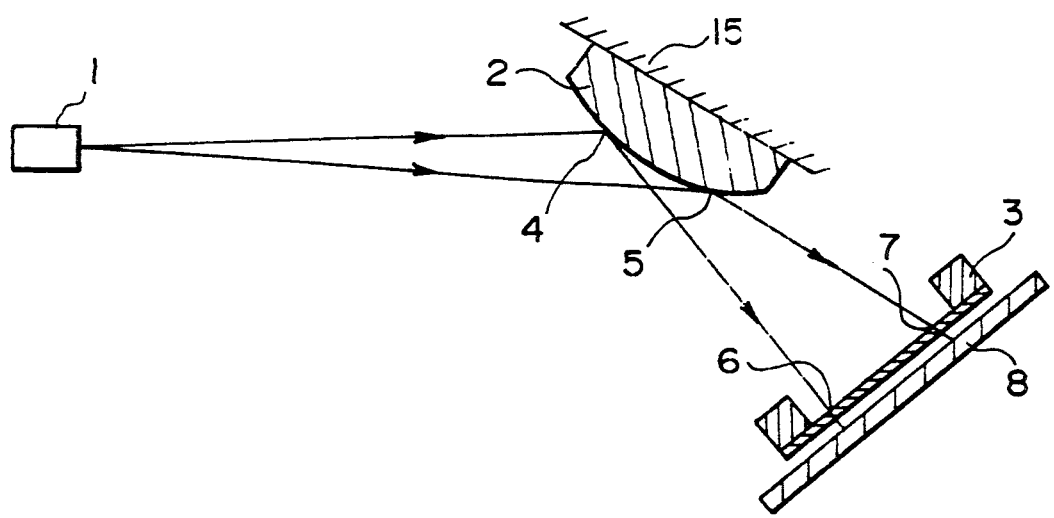
F I G. 1
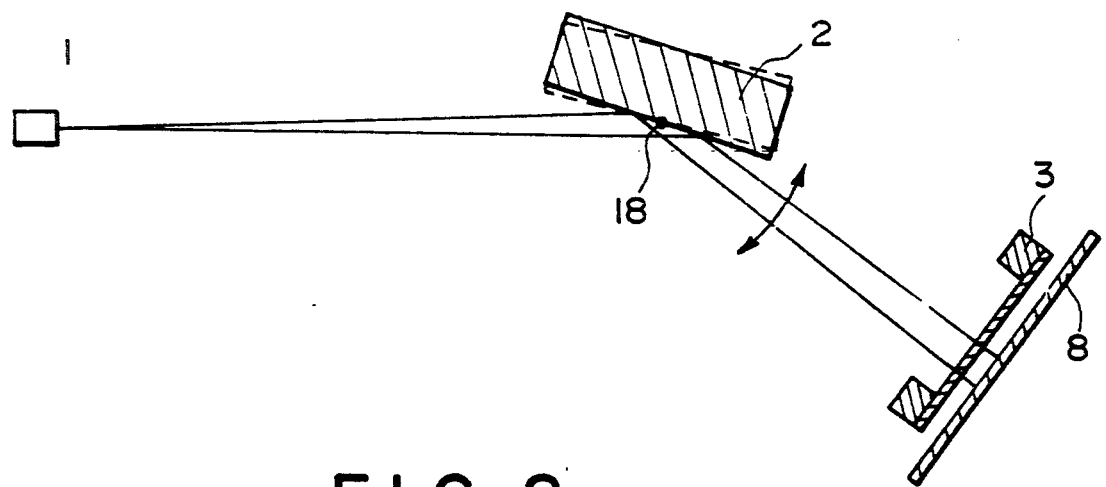
F I G. 2
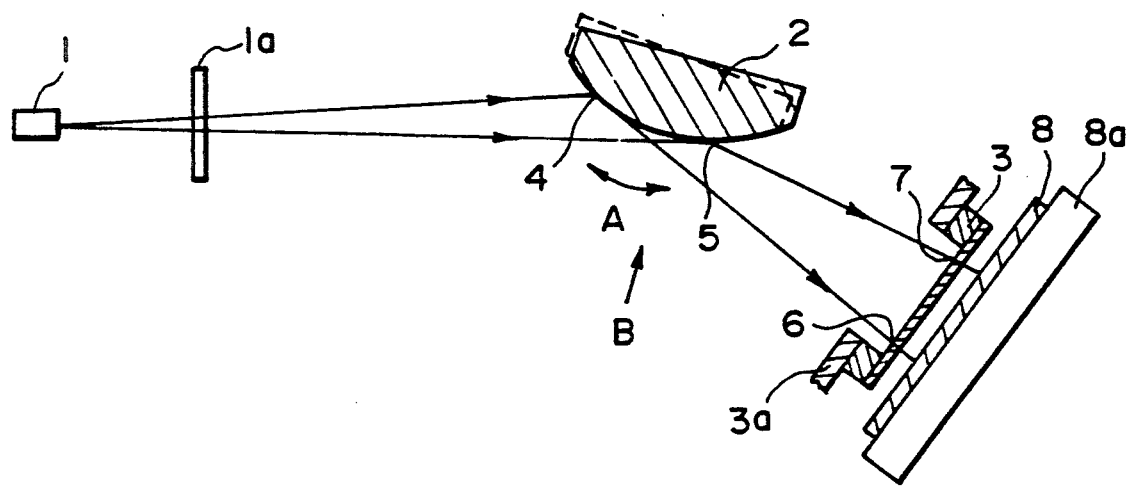
F I G. 3

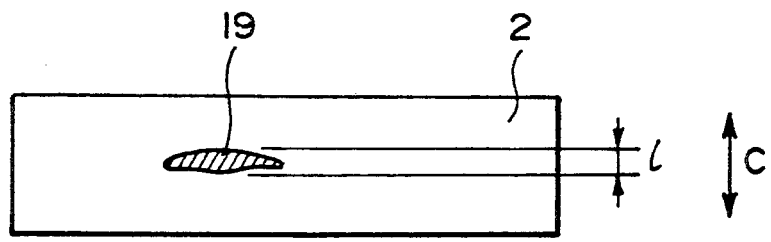
F I G. 6
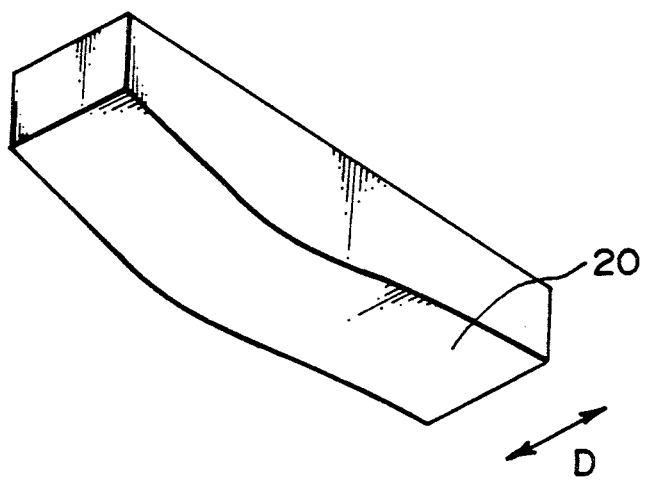
F I G. 8

REFLECTING DEVICE AND PATTERN TRANSFER APPARATUS USING THE SAME

FIELD OF THE INVENTION AND RELATED ART

This invention relates to a reflecting device usable in a semiconductor exposure apparatus, for example, for reflecting light having a high directivity.

In this Specification, the term "light" or "exposure beam" includes not only visible light but also electromagnetic waves such as, for example, infrared rays, ultraviolet rays and X-rays.

An illumination optical system in which synchrotron radiation light is used as an illumination source has been proposed as an exposure apparatus using X-rays. In such an illumination optical system, a reflection mirror is used so as to reduce the short-wavelength component adversely influencing the exposure and also to expand an exposure area.

In an exposure apparatus wherein a synchrotron radiation light having a high directivity is reflected by a mirror and then is projected to a mask, generally, the light impinging on a point on the mask is the light having been reflected from a limited region on the mirror. If, therefore, the mirror surface has a fault such as a scratch or it has dust or contamination attached thereto, then there is a possibility that the exposure beam is not reflected but is absorbed or scattered by the fault or the like. If this occurs, the point on the mask which corresponds to this reflection point on the mirror is not irradiated with the exposure beam or, alternatively, at that point on the mask the irradiation power reduces, thus resulting in insufficient exposure. Namely, on the mask surface, there is produced a difference in illuminance by the reflection light from a faultless portion of the mirror surface and the reflection light from the faulty portion of the mirror. This results in non-uniform exposure.

FIG. 1 shows a known type exposure apparatus. Denoted at 1 is an X-ray source such as a synchrotron orbit radiation (SOR) source; denoted at 2 is a convex mirror; denoted at 3 is a mask (photomask or reticle); and denoted at 8 is a wafer. The convex mirror 2 is fixed to a frame 15 of the apparatus. The exposure beam from the X-ray source 1 is reflected at points 4 and 5 on the convex mirror 2 surface and impinges on points 6 and 7 on the mask 3 surface. As seen in the drawing, the exposure beam from the X-ray source 1 irradiates the mask 3, with its beam section being expanded by the convex mirror 2. If the size of the light source is small, the points of irradiation on the mask correspond to the reflection points on the mirror in a one-to-one relationship (for example, the point 6 on the mask and the point 4 on the mirror; the point 7 on the mask and the point 5 on the mirror).

In the structure of this known type exposure apparatus, if a fault such as a scratch is present at the point 4 on the mirror 2 surface, the beam is absorbed or scattered by such portion, with a result that the point 6 on the mask 3 surface is not irradiated with the beam or, alternatively, at that point the irradiation power reduces. If, on the other hand, the point 5 on the mirror 2 is faultless, having no fault, a predetermined normal illuminance of exposure beam impinges on the point 7 on the mask 3 surface. As a result, there is produced a difference in illuminance between the points 6 and 7 on the mask 3 surface, thus causing non-uniformness in exposure.

FIG. 2 shows another example of expansion of illumination light, called the "mirror scanning method". This method uses a flat mirror 2 as an X-ray mirror which is swingable about an axis 18 to change the angle of reflection of the illumination light, to thereby scan a necessary exposure area. If, in this example, the mirror 2 surface has a fault such as a scratch, the regular reflection factor of that portion decreases and, as a result, on a corresponding part of the mask 3 a slit-like dark area, elongated in the beam scanning direction, is formed. Similarly, this causes non-uniform exposure.

SUMMARY OF THE INVENTION

It is accordingly, a primary object of the present invention to provide a reflecting device which is effective to prevent non-uniform exposure due to any fault of a reflection mirror, such as the presence of a scratch, adhesion of dust or contamination, or the like.

It is another object of the present invention to provide an exposure apparatus having such a reflecting device.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 1 and 2 are schematic views, respectively, showing exposure apparatuses of a known type.

FIG. 3 is a schematic view showing a major part of a pattern transfer apparatus according to a first embodiment of the present invention.

FIG. 6 is a schematic illustration, for explaining the reflection surface of a reflection mirror.

FIG. 8 is a perspective view showing a non-cylindrical mirror usable in a further embodiment of the present invention.

DESCRIPTION OF THE PREFERRED EMBODIMENTS

Figure 4:
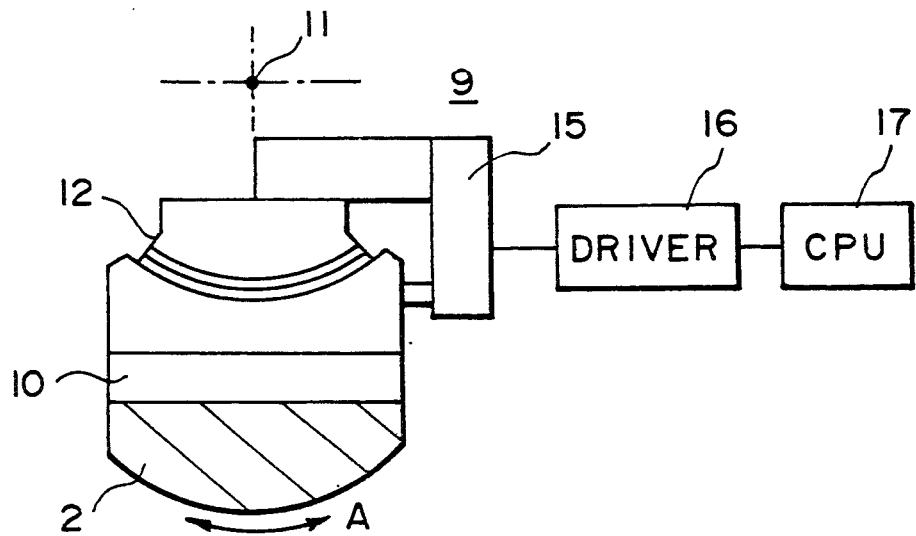
FIG. 4 is a schematic view showing the structure of a reflection mirror used in the first embodiment.

Referring now to FIG. 3, a first embodiment of the present invention will be explained. Denoted at 1 is an X-ray source such as a synchrotron orbit radiation (SOR) source; denoted at 1a is a shutter mechanism; denoted at 2 is a convex mirror (cylindrical mirror); at 3 is a mask (photomask or reticle); denoted at 3a is a mask chuck for holding the mask 3; denoted at 8 is a wafer; and denoted at 8a is a wafer chuck for holding the wafer. The convex mirror 2 is arranged so that, for example, it can be rotationally moved in the plane of reflection as depicted by an arrow A, namely, it can be moved without changing the direction of reflection and the spatial position of reflection. The exposure beam from the X-ray source 1 is reflected at points 4 and 5 on the convex mirror 2 surface and irradiates points 6 and 7 on the mask 3 surface. Here, even if a fault such as a scratch or the like is present at the position of the point 4 on the mirror 2 surface, moving the mirror 2 in a specified manner preferably by an amount of movement greater than the size of such fault is effective to prevent concentration of insufficiency in irradiation, due to the fault, upon the point 6 on the mask 3 surface and, thus, is effective to reduce non-uniformness in irradiation.

This will be described later in greater detail.

FIG. 4 shows the structure of a reflecting device usable in the first embodiment of the present invention and including a convex mirror 2. The mirror 2 is a cylindrical mirror having a convex surface, adapted to expand the X-rays from the synchrotron source so as to ensure an illumination region necessary for the exposure. The mirror 2 is held by a holder 10 which in turn is mounted to a mirror driving mechanism 9. Numeral 11 denotes the central axis of the cylindrical surface of the mirror 2 and, about this axis 11, the mirror driving mechanism 9 pivotably rotates the mirror 2 together with the holder 10, in the circumferential direction of the cylindrical surface, as depicted by an arrow A. Numeral 12 denotes a guiding means for guiding the rotational direction. Denoted at 15 is an actuator of the driving mechanism; denoted at 16 is a driver for the actuator 15; and at 17 is a central processing unit (CPU) which is operable to supply an instruction signal to the driver 16 to energize the actuator 15. Also, the CPU 17 is operable to supply an instruction signal to the shutter mechanism 1a, shown in FIG. 3, to control the opening/closing of the shutter mechanism, namely, to control the exposure.

It is to be noted here that the action of the driving mechanism as illustrated in FIG. 3 essentially differs from the action of a mirror in expansion of illumination light by the mirror scanning method, having been proposed as an illumination system in an X-ray exposure apparatus using synchrotron radiation. This will be explained below, in detail.

In the mirror driving mechanism 9 of the present embodiment, the central axis of the curvature of the cylindrical mirror 2 coincides with the center of rotation of rotational motion of the mirror. As a result, even when the mirror 2 is moved by the driving mechanism, the shape and orientation of the part of the reflection surface, to which the X-rays are inputted, are maintained constant.

Accordingly, the light reflected by the mirror 2 irradiates the exposure area on the mask 3, with the direction of reflection and the spatial position of reflection being unchanged. As a result, the expansion of reflected light as well as the position of incidence of the light upon the mask do not change. If, at this time, a fault such as a scratch or contamination is present in a portion of the reflection surface of the mirror 2, which fault leads to a decreased reflection factor, then the intensity in such part of the illuminated area on the mask, irradiated with the light from such faulty portion is low as compared with that as provided by the remaining faultless portion of the mirror. However, because the reflection surface is moving, such lower intensity part does not remain at a fixed site in the exposure area.

As described above, by moving the reflection surface of the mirror 2 through the mirror driving mechanism 9, during one exposure, in the manner not changing the shape and orientation of a part to which the X-rays are inputted, it is possible to disperse, within the range of movement, the lower reflexible portion of the mirror reflection surface due to the fault, or to disperse the non-uniformness in reflection factor within the range of movement. Therefore, it is possible to increase the uniformness in intensity of illumination, within the exposure area.

Figure 5:
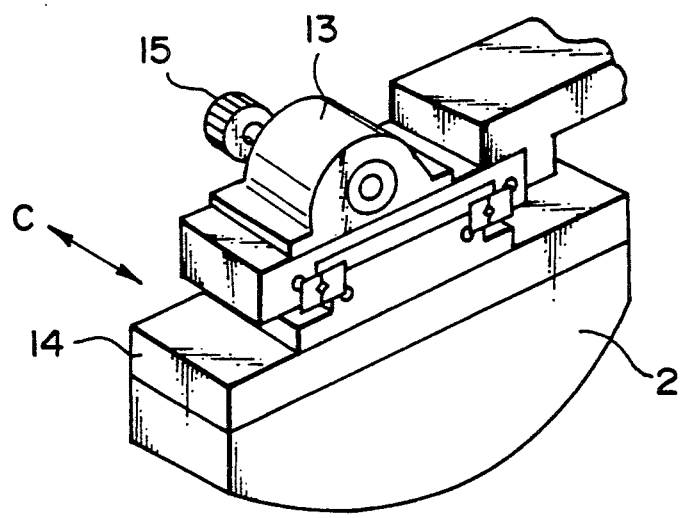
FIG. 5 is a fragmentary perspective view showing a reflection mirror used in a pattern transfer apparatus according to a second embodiment of the present invention.

FIG. 5 shows another embodiment of the present invention. Convex mirror 2 is mounted through a holder to a mirror driving mechanism 13. In the present embodiment, the mirror driving mechanism 13 is adapted to rectilinearly and reciprocatingly move the cylindrical mirror, in the direction of an axis of the mirror (or along its generating line), as indicated by an arrow C. With such rectilinear motion of the mirror, the reflection surface can be moved with the direction of reflection being unchanged. The structure and function of the remaining part of this embodiment is similar to that of the embodiment shown in FIGS. 3 and 4.

Also, while not shown in the drawings, the FIG. 4 embodiment and the FIG. 5 embodiment may be combined into such a structure wherein the reflection surface is moved at the same time in both the direction of arrow A and the direction of arrow C. The same effect is obtainable.

Depending on the distribution of non-uniformness in reflection factor due to a scratch or the like on the reflection surface of the mirror, there may be an optimum direction of movement for the reflection surface. FIG. 6 shows the reflection surface of the mirror 2, as viewed in the direction of an arrow B in FIG. 3. The region 18 depicted by hatching is the part in which the reflection factor is decreased. This part has a width 1 in the direction of an arrow C. If the shape of any lower reflectivity portion is predetected as in the case of the FIG. 6 example, the mirror 2 is moved in the direction of arrow C preferably through a distance not less than the width 1. By doing so, no portion of the mask is continuously illuminated with a low-intensity light as reflected from the low-reflectivity part of the mirror and, as a result, it is possible to reduce the non-uniformness in exposure. Since, in this example, the size of the low-reflectivity part is smaller in the direction of arrow C than in the direction perpendicular to the direction C, if the amount of movement is fixed, moving the reflection surface in the direction of arrow C provides a higher effect of dispersing the non-uniformness in exposure.

The device may be structured to allow selection of the direction of movement, such that in accordance with the shape of a scratch or the like the reflection surface is moved in one of the directions A and C in which higher dispersion effect is obtainable. Further, the driving mechanism may be arranged to allow adjustment of the driving distance, such that in accordance with the size of a scratch or the like the reflection surface can be moved through a distance greater than the size of the scratch or the like.

Figure 7:
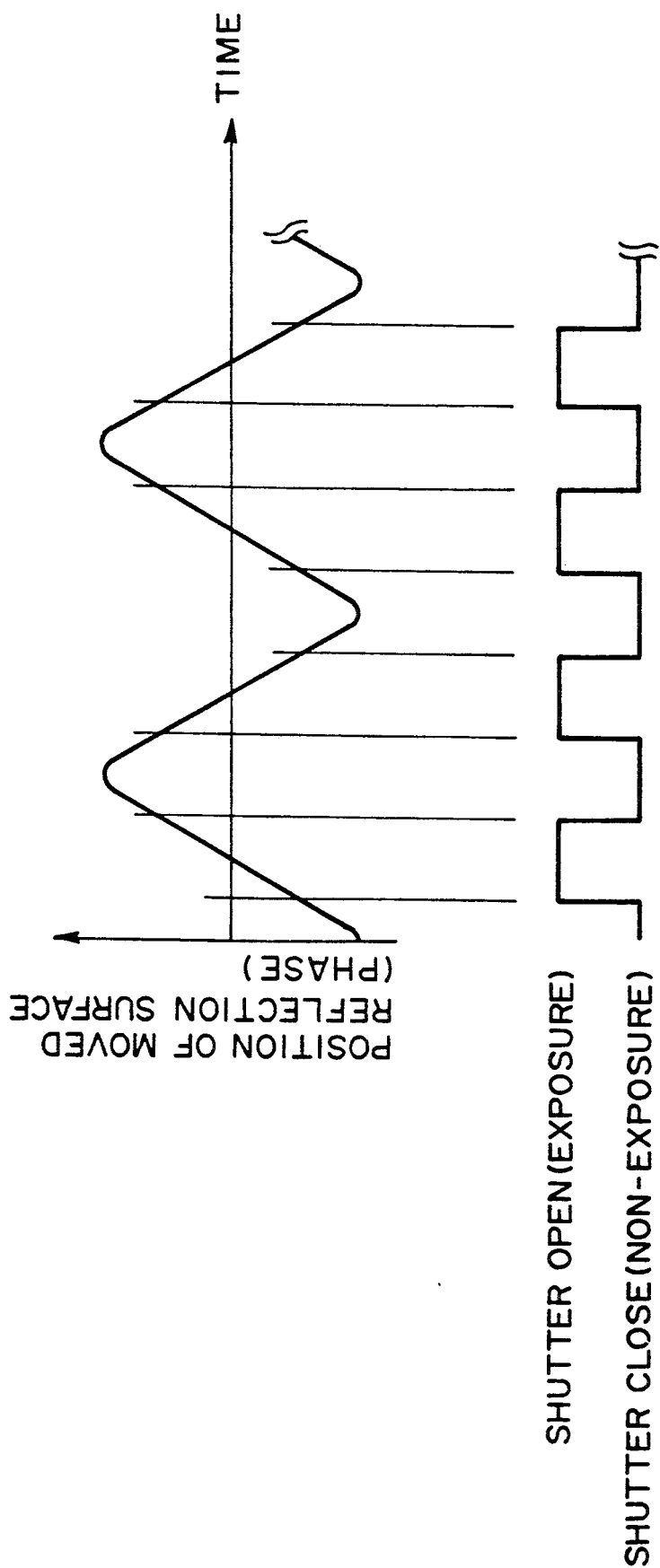
FIG. 7 is a chart, illustrating the relationship between the mirror motion and the exposure timing.

A description will now be provided of another aspect of the present invention. The effect of the present invention can be enhanced by controlling the timing of exposure in relation to the action of the mirror driving mechanism 9. FIG. 7 is a timing chart showing the relationship between the exposure and the action of the mirror driving mechanism 9 or 13 shown in FIG. 3 or 4. Preferably, during exposure, the mirror is continuously moved or oscillated in order to prevent the lowered intensity part of the illumination light from remaining at a fixed site in the exposure area. The CPU 17 shown in FIG. 4 can operate to control the operation timing of the mirror driving mechanism and the shutter mechanism 1a (FIG. 3) of the exposure apparatus, to accomplish the exposure operation in the manner as illustrated in FIG. 7.

More specifically, as illustrated in FIG. 7, at the time of start of the oscillating movement of the mirror, the shutter mechanism is closed and the exposure is not performed. As the mirror moves in one direction, the shutter mechanism is opened to start exposure. Before the motion of the mirror is reversed, the shutter mechanism is closed to intercept the exposure. As the mirror moves in an opposite direction, the shutter mechanism is opened again to re-start the exposure Further, before the motion of the mirror is reversed again, the shutter mechanism is closed to intercept the exposure. This may be repeated to carry out successive exposures.

While in the foregoing embodiments the reflection mirror has been explained as a cylindrical mirror, it may be a non-cylindrical mirror such as illustrated in FIG. 8, for example. The non-cylindrical mirror shown in FIG. 8 has a reflection surface 20 which has no curvature in respect to the detection of an arrow D but it has a varying curvature in a plane perpendicular to the direction D. By moving this mirror in the direction of arrow D, substantially the same effect is obtainable.

Further, the present invention is applicable also to cases using a troidal mirror, a flat mirror, a spherical mirror and the like and, by moving these mirrors without changing the shape and orientation of such part of the reflection surface to which the X-rays are inputted, substantially the same effect as in the case of a cylindrical mirror, is obtainable.

Figure 9:
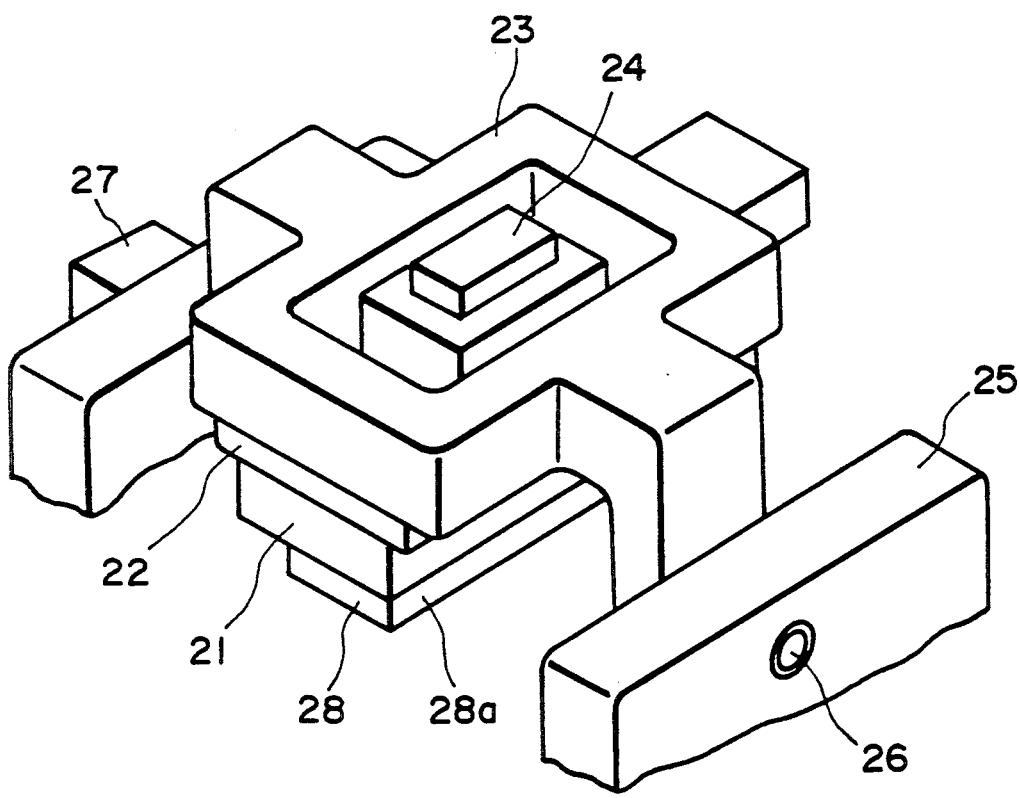
FIG. 9 is a fragmentary perspective view showing a reflecting device according to a still further embodiment of the present invention, which is applied to a mirror scanning type exposure apparatus.

Further, the present invention is applicable also to the mirror scanning method as illustrated in FIG. 2. FIG. 9 shows the structure of a reflecting device in accordance with a further embodiment of the present invention, wherein the invention is applied to the mirror scanning method.

In FIG. 9, denoted at 28 is a mirror effective to reflect X-rays and having a flat reflection surface 28a. The mirror 28 is held by a mirror holder 21. Denoted at 22 is a guide mechanism, through which the mirror holder 21 is movable relatively to a swingable frame 23 in a direction parallel to the reflection surface 28a of the mirror 28 (more particularly, in a direction parallel to the axis of rotation to be described later). Denoted at 24 is a driving mechanism for moving the mirror holder 21 in this direction.

The swingable frame 23 is mounted to a stationary frame 25, for rotational motion about a rotational shaft 26. Denoted at 27 is another driving mechanism for rotationally moving the swingable frame 23 about the shaft 26. The extension of the central axis (axis of rotation) of the rotational shaft 26 lies in the plane of the reflection surface 28a of the mirror 28.

In exposure operation, the swingable frame 23 is rotationally moved by means of the driving mechanism 27, such that the mirror reflection surface 28a is pivotally moved about the rotational shaft 26. As a result, the angle of reflection of irradiating X-rays is changed, as has been described with reference to FIG. 2, and a desired exposure area is scanned by the X-rays. During this scan, the driving mechanism 24 operates to move the mirror holder 21, relatively to the swingable frame 23, in a direction parallel to the reflection surface 28a, i.e., in a direction parallel to the axis of rotation (shaft 26), in this embodiment. By this, the mirror reflection surface 28a which is pivotally moving can be moved at the same time in the direction parallel to the axis of pivotal movement. In this case, the movement of the reflection surface 28a in the direction parallel to the axis of pivotal movement does not influence the position of scan of the exposure area with the X-rays. Since, however, during the exposure the part of the reflection surface 28a to which the X-rays are inputted changes, the effect of any fault such as a scratch, for example, on the reflection surface of the mirror can be dispersed. As a result, it is possible to prevent formation of a slit-like dark zone in the exposure area, elongated in the scan direction of the beam.

In this embodiment, it is desirable to oscillate, during one scanning operation, the reflection mirror in a direction parallel to the axis of rotation, by sufficient times. The direction of oscillation is not limited to the direction parallel to the axis of rotation as described, provided that it is parallel to the reflection surface 28a of the mirror. For example, it may be one perpendicular to the axis of rotation.

The driving means 27 may operate to pivotally move the swingable frame 23 so that the same exposure area (e.g. a pattern region of one and the same mask) is scanned by plural times. In that case, during one scan of the exposure area, the driving means 24 may be held inoperative. After the one scan of the exposure area with the X-rays is completed and during a time period in which the reflection surface 28a is in an angular range effective to direct the X-rays to the outside of the exposure area, the driving means 24 may be operated under the influence of a control means (not shown) to move the reflection surface 28a so that a part of the reflection surface 28a, different from the part to which the X-rays have been inputted in the preceding scan, can function to receive the X-rays in the succeeding scan. Before the reflection surface 28a moves to its angular position effective to start the succeeding scan, the driving means 24 may be deactuated under the influence of the unshown control means. The above-described operations may be repeated, if necessary. With these operations, substantially the same effect is obtainable.

While in the foregoing embodiments the invention has been described with reference to a reflecting device and a pattern transfer device usable with X-rays, as a matter of course the invention is applicable to such device and apparatus for use with the other electromagnetic waves such as visible light, ultraviolet light and the like.

In accordance with the present invention, as described hereinbefore, it is possible to effectively reduce non-uniformness in illuminance by reflection light from a reflection surface, due to any fault thereon.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus comprising:
   holding means for holding a member to be exposed;
   a movable mirror having a reflection surface for reflecting an X-ray beam from a radiation source to direct the X-ray beam along a path toward the member for exposure of the member with the X-ray beam; and moving means for moving, during the exposure of the member, said reflection surface of said movable mirror without causing any substantial change in the path of the X-ray beam to thereby reduce non-uniformness of the exposure of the member to the X-ray beam resulting from a defect in said reflection surface of said movable mirror.

2. An apparatus according to claim 1, further comprising a mask holder for holding a mask, having a pattern, on the path of the X-ray beam such that the member can be exposed with the X-ray beam passing through the mask.

3. An apparatus according to claim 1, further comprising driving means for swingingly moving said reflection surface of said movable mirror about a predetermined axis so as to scanningly expose the member with the X-ray beam, wherein said moving means moves said reflection surface of said movable mirror along said predetermined axis.

4. An apparatus according to claim 3, wherein said reflection surface of said movable mirror is flat.

5. An apparatus according to claim 1, wherein said reflection surface of said movable mirror is curved.

6. An apparatus according to claim 5, wherein said reflection surface of said movable mirror has a cylindrical shape.

7. An apparatus according to claim 6, wherein said moving means moves said reflection surface in at least one of a direction along a generating line of the cylindrical shape and a direction along said curved surface.

8. An apparatus according to claim 1, wherein the defect in said reflection surface has a particular size and wherein said moving means moves said reflection surface through a distance larger than the size of the defect.

9. An apparatus according to claim 1, wherein said moving means moves said reflection surface of said movable mirror also in a non-exposure period for the member, and wherein said apparatus further comprises a shutter mechanism disposed on a path of the X-ray beam from the radiation source, for controlling the exposure period and non-exposure period for the member.

10. A method of manufacturing semiconductor devices comprising the steps of:

reflecting an X-ray beam with a reflection surface of a mirror to direct the X-ray beam along a path toward a mask and a wafer for exposure of the wafer with the X-ray beam; and during exposure of the wafer to the X-ray beam, moving the reflection surface of the mirror without causing any substantial change in the path of the X-ray beam, to thereby reduce non-uniformness of the exposure of the wafer to the X-ray beam resulting from a defect in the reflection surface of the mirror.

* * * * *